(12) United States Patent
Kawasumi

(10) Patent No.: US 7,218,549 B2
(45) Date of Patent: May 15, 2007

(54) MEMORY CELL WITH STABILITY SWITCH FOR STABLE READ OPERATION AND IMPROVED WRITE OPERATION

(75) Inventor: Atsushi Kawasumi, Kawasaki (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 10/906,032

(22) Filed: Jan. 31, 2005

(65) Prior Publication Data

US 2006/0171188 A1   Aug. 3, 2006

(51) Int. Cl.
*G11C 11/00* (2006.01)
(52) U.S. Cl. .................. 365/154; 365/189.11
(58) Field of Classification Search ............... 365/154
See application file for complete search history.

(56) References Cited

U.S. PATENT DOCUMENTS

| | | | | |
|---|---|---|---|---|
| 5,477,489 A | * | 12/1995 | Wiedmann | ............. 365/189.04 |
| 6,061,267 A | * | 5/2000 | Houston | ..................... 365/154 |
| 6,529,400 B1 | * | 3/2003 | Bhavnagarwala et al. | .. 365/154 |
| 6,649,456 B1 | * | 11/2003 | Liaw | ........................ 438/153 |
| 2003/0002329 A1 | * | 1/2003 | Wong | ........................ 365/156 |
| 2005/0213370 A1 | * | 9/2005 | Khellah et al. | ............. 365/154 |

OTHER PUBLICATIONS

Bernstein, K. et al., SOI Circuit Design Concepts, ISBN 0-7923-7762-1, Chapter 6.3.2, pp. 124-128.
Marshall, A. et al., SOI Design: Analog, Memory and Digital Techniques, ISBN 0-7923-7640-4, Chapter 8.6, pp. 197-200.
Bernstein, K. et al., SOI Circuit Design Concepts, ISBN 0-7923-7762-1, Chapter 6.4, pp. 131-137.

* cited by examiner

*Primary Examiner*—Thong Q. Le
(74) *Attorney, Agent, or Firm*—Stephen B. Parker; Watchstone P+D, plc

(57) ABSTRACT

A memory cell and method of destabilizing a memory cell for facilitating a write operation are provided. A stability switch is coupled between one of a voltage supply or a ground terminal and the memory cell, and is turned off during the write operation to reduce the drive voltage required to drive a bit value into the memory cell.

20 Claims, 3 Drawing Sheets

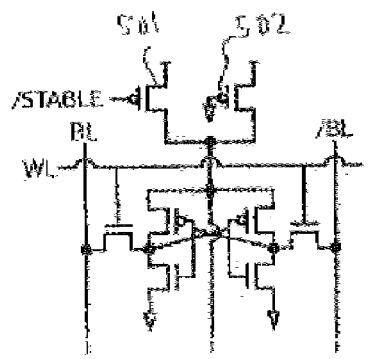
FIG. 5
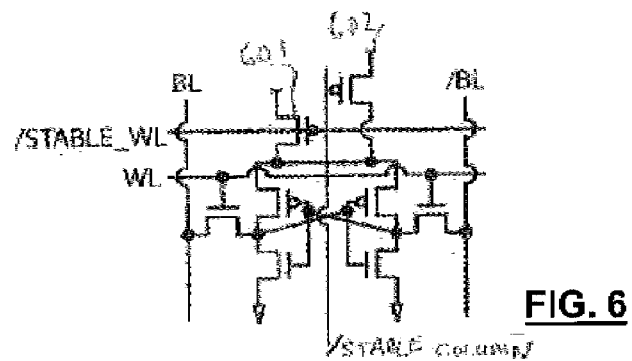
FIG. 6
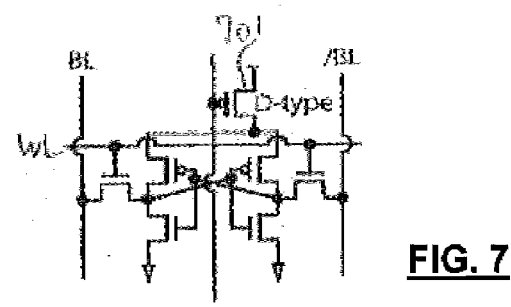
FIG. 7
FIG. 8
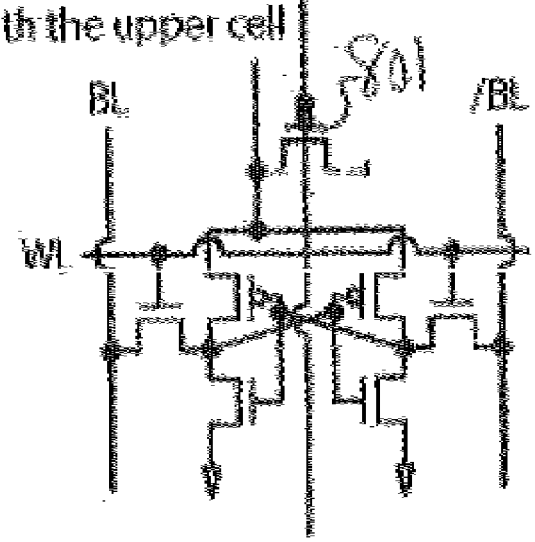

FIG. 9
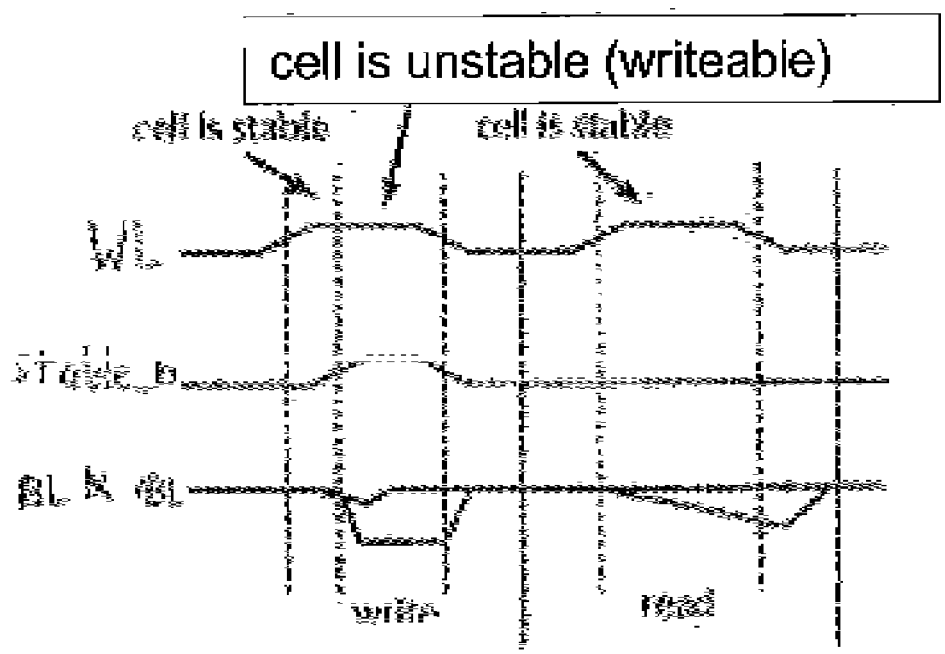
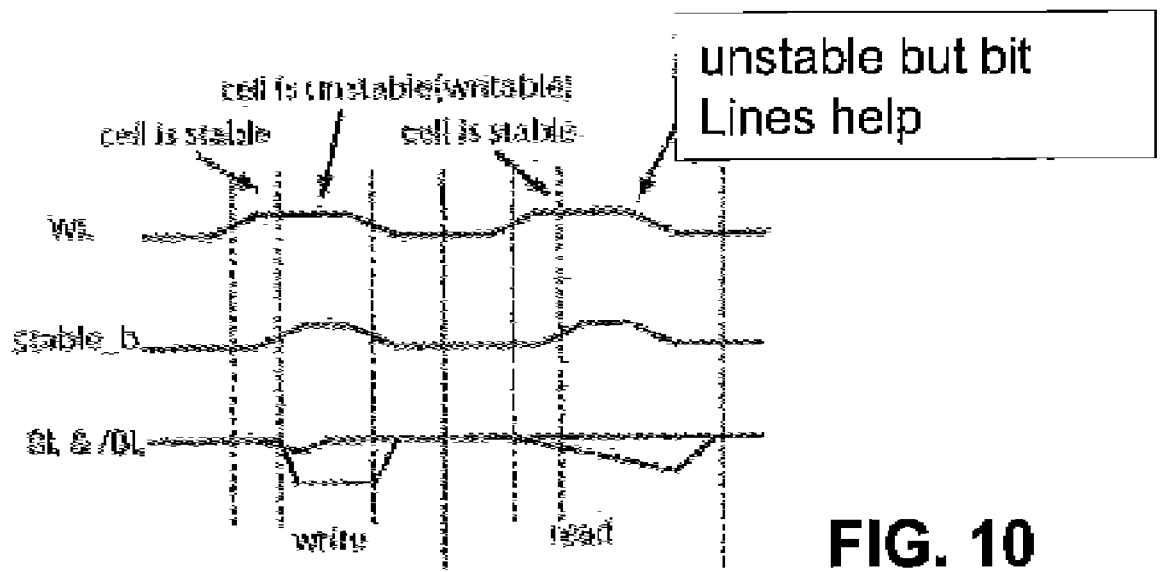
FIG. 10

MEMORY CELL WITH STABILITY SWITCH FOR STABLE READ OPERATION AND IMPROVED WRITE OPERATION

FIELD OF THE INVENTION

The present invention relates generally to solid state memory devices, such as semiconductor memory arrays, and more particularly to memory cell structures for such arrays.

BACKGROUND OF THE INVENTION

The insulated-gate field-effect transistor (IGFET) has been arranged in various configurations of bistable stages, or cells, resembling bipolar transistor flip-flops. Unlike a conventional bipolar junction transistor, in which both majority and minority carriers are required for operation, an IGFET is a unipolar transistor to the extent that only majority carriers are required for operation. Conduction in an IGFET device is controlled by signals applied to a control electrode, without any current flow between the control electrode and controlled electrodes because the control electrode is insulated from the controlled electrodes. IGFET memory cells consume significantly less power than bipolar transistor cells.

In the background art, each IGFET memory cell generally requires at least four leads to the cell, a pair of cross-coupled inverter IGFET devices, a pair of load devices, and two additional gating IGFET devices for transferring information into and out of the cell.

A typical memory cell 100 as shown in FIG. 1 includes a pair of pull-up PMOS (p-channel metal-oxide-semiconductor) inverter transistors 101 and 102, and a pair of pull-down NMOS driver transistors 103 and 104. The gate electrodes of transistors 101 and 103 are cross-coupled to the gate electrodes of transistors 102 and 104. The transistors 101–104 comprise a data storage device, which serves to store bit values of "0" or "1." The memory cell 100 further includes a pair of NMOS transfer transistors 105 and 106. Transistors 105 and 106 comprise data transfer devices, which serve to transfer information into and out of the memory cell 100.

Transfer transistor 105 is coupled to bit line BL and to node 1001 between the drain electrode of transistor 101 and the source electrode of transistor 103. Transfer transistor 106 is similarly coupled to complementary bit line /BL and to node 1002 between the drain electrode of transistor 102 and the source electrode of transistor 104. A gate electrode of each of transfer transistors 105 and 106 is coupled to word line WL. The transfer transistors 105 and 106 are thus made conductive by activating word line WL (i.e., by supplying a high voltage level to WL), which electrically connects bit line BL to node 1001 and complementary bit line /BL to node 1002.

The bit value of a memory cell is conventionally considered to be the value at node 1001, which is read out on bit line BL. When a bit value at node 1001 is "1" ($V_{1001}=V_{cc}$) a bit value at node 1002 is "0" ($V_{1002}=0$). Consequently, in this state, transistor 101 is turned on and transistor 103 is turned off by the voltage at node 1002, thereby keeping the voltage of node 1001 at $V_{cc}$. Similarly, the voltage $V_{cc}$ at node 1001 turns off transistor 102 and turns on transistor 104, thereby coupling node 1002 to ground and keeping the voltage of node 1002 at $V_{1002}=0$.

At the beginning of a read operation, bit lines BL and /BL are pre-charged to the supply voltage by a pre-charge signal. The word line WL is then enabled to turn on data transfer transistors 105 and 106 and thereby to connect bit-line BL to node 1001 and complementary bit-line /BL to node 1002. Because both bit line BL and node 1001 are at the supply voltage $V_{cc}$, the voltage on bit line BL remains substantially unchanged. However, because complementary bit line /BL is now coupled to ground through turned-on transistors 106 and 104, the pre-charge voltage at bit line /BL will be discharged to ground. As is well-known, sense amplifiers coupled to the bit lines BL and /BL sense the difference between the voltages on bit line BL and complementary bit line /BL to determine that memory cell 100 stores a bit value of "1."

However, as the voltage on complementary bit-line /BL decreases below the supply voltage $V_{cc}$, the voltage at node 1002 will begin to rise above ground because transistors 104 and 106 will act as a voltage divider. Thus there exists the possibility that the voltage at node 1002 may rise to a level that undesirably causes the memory cell 100 to switch its stored value from a "1" to a "0."

As one conventional way to prevent this, the resistance of the transfer transistor 106 may be made higher than the resistance of driver transistor 104, such as by lengthening the channel of transistor 106. Conventionally, the IGFET devices have width-to-length ratios which are interrelated. The width w of each channel is the distance across the substrate surface of the semiconductor channel in a direction perpendicular to the direction of current in the channel. The length l of each channel is the distance between the source and drain electrodes in the direction of the current in the channel. The load devices have essentially equal width-to-length ratios w/l (L), and the gating devices also have essentially equal width-to-length ratios w/l (G). A relative ratio R relating the width-to-length ratios of the load and gating devices is given:

$$\text{as } R = \frac{w/l(L)}{w/l(G)}.$$

If in a particular cell the ratio R is too small, stored information can be lost during a read operation because both cross-coupled inverter devices will be pulled into conduction rather than just one of them. This loss of information occurs because the voltage drop across one inverter transistor, which is correctly conducting, exceeds the threshold voltage of the opposite inverter transistor and causes it to also conduct but in error. On the other hand, if the ratio R is too large, bit-writing into the memory cell is made more difficult because very large voltage swings are required on the bit lines and on the word line for changing the state of the cell. This difficulty of changing the state of the cell occurs because the large ratio R involves devices which require more current through either inverter transistor to establish a source-to-drain voltage that exceeds the threshold voltage of the opposite inverter transistor.

Consequently, there is a trade-off balance that must be reached between providing a highly stable memory cell in which data is reliably stored without the possibility of loss of information during a read operation, and providing a memory cell to which a write operation can be performed without requiring very large voltage swings.

In the conventional art, progress in small scaling technology (such as by providing shared a write circuit for plural memory cells) has resulted in increased variation in transistor threshold voltage $V_{th}$ caused by modification of the channel w/l ratio, which has led to "tweaking" of device size to maintain memory cell stability, i.e., preventing inadvertent "flipping" of a bit value stored in a memory cell when the memory cell is subjected to a read operation.

However, as explained above, increasing the stability of the memory cell makes writing operations more difficult. There thus exists a need in the art for improvements to semiconductor memory cells to eliminate the shortcomings mentioned above, e.g, to realize a stable memory cell that also exhibits good write operation characteristics.

SUMMARY OF THE INVENTION

The present invention eliminates the shortcomings in the background art and provides a significant advance in the art, by providing an improved semiconductor memory cell structure with good stability and facilitated write operation.

According to one illustrative embodiment, the present invention provides a memory cell, including a word line, a bit line, a complementary bit line, a first node storing a bit value voltage level, a second node storing a complementary bit value voltage level, a first pull-down driver transistor coupled between said first node and a ground level, a first pull-up transistor coupled between said first node and a supply voltage source, and a stability switch connected coupled to at least one of said first pull-up transistor and said first pull-down transistor, for destabilizing the memory cell during a write operation.

In some embodiments, the stability switch is coupled between a voltage supply and the first pull-up transistor.

In some embodiments, the stability switch is controlled by a signal line distributed in a word line direction of the memory cell.

In some embodiments, the stability switch is controlled by a signal line distributed in a bit line direction of the memory cell.

In some embodiments, the stability switch is a D-type switch.

In some embodiments, the memory cell further comprises a normally-on switch connected in parallel with the stability switch between the voltage supply and the first pull-up transistor.

In some embodiments, the stability switch is controlled by a signal line distributed in a word line direction of the memory cell.

In some embodiments, the stability switch is controlled by a signal line distributed in a bit line direction of the memory cell.

In some embodiments, the memory cell comprises a second pull-up transistor and second pull-down transistor, and a second stability switch connected between the voltage supply and the second pull-up transistor.

In some embodiments, the first stability switch and second stability switch are controlled by a common signal line.

In some embodiments, the common signal line is distributed in a word line direction.

In some embodiments, the common signal line is distributed in a bit line direction.

In some embodiments, the first stability switch is controlled by a first signal line and second stability switch is controlled by a second signal line.

In some embodiments, the first signal line is distributed along a word line direction, and the second signal line is distributed along a bit line direction.

In some embodiments, the stability switch is cut off during a write operation.

In some embodiments, the stability switch is cut off during a write operation and during a read operation.

According to another aspect of the invention, a method of destabilizing a memory cell for facilitating a write operation is provided, comprising the steps of providing a stability switch coupled between one of a voltage supply or a ground terminal and a memory cell, and causing the stability switch to be turned off during the write operation.

In some embodiments, the method further comprises the step of causing the stability switch to be turned off during a read operation.

In some embodiments, the method further comprises that the stability switch is controlled by a signal line distributed along a word line direction of the memory cell.

In some embodiments, the method further comprises that the stability switch is controlled by a signal line distributed along a bit line direction of the memory cell.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/ or advantages of particular embodiments should not be construed as limiting other embodiments or the claims.

BRIEF DESCRIPTION OF THE DRAWINGS

The illustrative embodiments of the present invention are shown by a way of example, and not limitation, in the accompanying figures, in which:

FIG. 5 is a circuit diagram of a fourth embodiment of the invention, having a stability switch line in a bit line direction and a normally-on switch parallel to the stability switch;

FIG. 6 is a circuit diagram of a fifth embodiment of the invention, having stability switches coupled in both word line and bit line directions;

FIG. 7 is a circuit diagram of a fifth embodiment of the invention, having a D-type stability switch;

FIG. 8 is a circuit diagram of a sixth embodiment of the invention, having a stability switch that is shared with an adjacent memory cell;

FIG. 9 is a waveform diagram illustrating operation of a memory cell according to embodiments of the invention with a stability switch cut off during a write operation only; and FIG. 10 is a waveform diagram illustrating operation of a memory cell according to embodiments of the invention with a stability switch cut off synchronized with word line address signaling.

DETAILED DESCRIPTION OF THE EMBODIMENTS

While the present invention may be embodied in many different forms, a number of illustrative embodiments are described herein with the understanding that the present disclosure is to be considered as providing examples of the principles of the invention and that such examples are not intended to limit the invention to illustrative embodiments described herein and/or illustrated herein.

According to the illustrative embodiments of the present invention, in order to solve the problem in the background art wherein write operations are made difficult when memory cell stability is increased by lengthening the channel length of data transfer transistors (or minimizing the ratio w/l), a stability switch is implemented between the memory cell and either the voltage supply $V_{dd}$ or ground.

When performing a write operation, the stability switch is switched off. In this manner, the write operation can be easily accomplished to drive the bit value into the cell, by reducing the magnitude of the voltage swing required to change the bit value in the memory cell. The switch can be controlled either word-by-word, or bit-column by bit-column, so as to achieve an addressable memory cell array configuration.

When performing a read operation, the stability switch does not have to be switched off; however it can be switched off once bit-line precharging has been sufficiently developed so as to reduce switching complexity for write and read operations.

When the stability switch is switched off, the data present in a bit-line pair can be easily driven into the cell, because the data signal amplitude between complementary nodes in the cell is less than full-rail, as single NMOS transistor channels are used for the writing operation. However, after the stability switch is turned on (e.g., upon completion of a write operation), the memory cell itself amplifies the signal between the complementary nodes, such that a full-rail voltage difference is developed.

Figure 3:
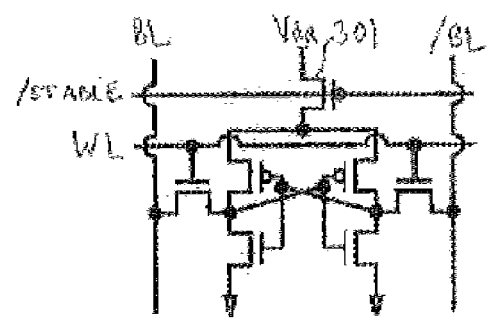
FIG. 3 is a circuit diagram of a second embodiment of the invention, having a floating node stability switch line.

The stability switch can be implemented in a number of different configurations according to the concepts of the present invention. As shown in FIG. 3, according to one illustrative embodiment, a stability switch 301 is controlled by a stability switch signal line/stable. The switch 301 is connected between the voltage supply $V_{dd}$ and the pull-up transistors of the memory cell. As shown in FIG. 9, when a write operation is to be carried out (by driving complementary bit-lines BL and /BL) the switch 301 is cut off so as to reduce the voltage amount required to drive the bit value into the cell. While during a read operation, the switch 301 does not need to be turned off.

In contrast, as shown in FIG. 10, in order to reduce the complexity required in controlling stability switch 301 to cut off only during write operations, the switch control can be synchronized with word line addressing, as shown in FIG. 10. In this instance, the pre-charged complementary bit-lines BL and /BL keep the memory cell stable for read operations.

Figure 1:
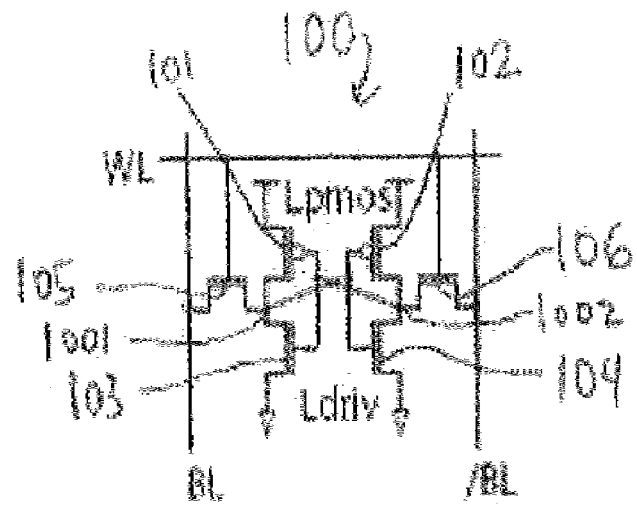
FIG. 1 is a circuit diagram of a conventional six transistor memory cell to which an illustrative embodiment of the invention is applied.
Figure 2:
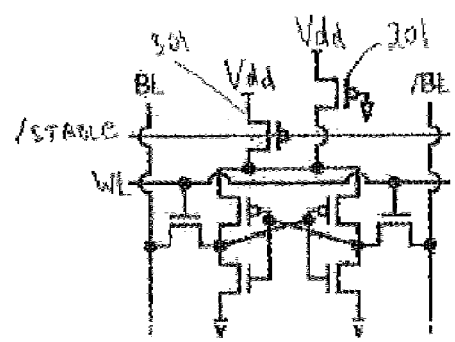
FIG. 2 is a circuit diagram of a first embodiment of the invention, having a stability switch line in a word line direction and a normally-on switch parallel to the stability switch.

It is noted that it is not necessary to completely cut the voltage supply $V_{dd}$ from the memory cell in a write operation, but instead it will suffice if the cell could be "softened" by just weakening the drivability requirement of the flip-flop circuit. In this regard, an alternate embodiment of the invention as shown in FIG. 2 includes a normally-on switch 201 in parallel with the stability switch 301 in a word line distributed direction. When the switch 301 is cut off, a reduced voltage is applied to the flip-flop during a write operation, which improves the writability of the cell. Alternatively, as shown in the embodiment of FIG. 5, a normally-on switch 502 can be provided in parallel with a stability switch 501 in a bit line distributed direction.

Figure 4:
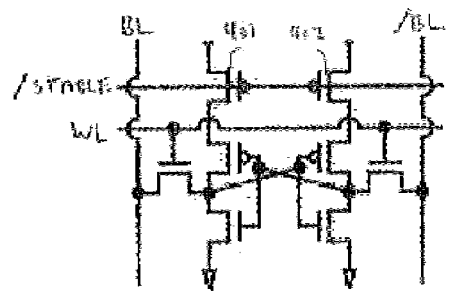
FIG. 4 is a circuit diagram of a third embodiment of the invention, having two symmetrical stability switches coupled to a stability line parallel to a word line.

FIG. 4 illustrates another alternate illustrative embodiment of the invention, having symmetrical stability switches 401 and 402, each coupled to a respectively one of a cross-coupled pair of pull-up flip-flop transistors.

FIG. 6 illustrates yet another alternate illustrative embodiment of the invention, having stability switches 601 and 602, wherein switch 601 is coupled to the cell in a word line direction, and switch 602 is coupled to the memory cell in a bit line (or column) direction.

FIG. 7 illustrates an additional alternate illustrative embodiment of the invention, having a D-type (delay) switch 701 in a bit line direction, wherein the timing of the switch cut-off signal can be delayed with respect to the timing of the word line enable signal.

FIG. 8 illustrates another alternate illustrative embodiment of the invention, having a stability switch 801 that is shared with an adjacent memory cell (not shown), such that one switch can be used to prepare two (or possibly more) memory cells for a write operation.

As mentioned above, instead of being coupled between the voltage supply $V_{dd}$ and the memory cell, the stability switch may be coupled between the memory cell and ground, to accomplish the same purpose in "softening" the memory cell for a write operation.

Broad Scope of the Invention

While illustrative embodiments of the invention have been described herein, the present invention is not limited to the various illustrative embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims (e.g., including that to be later added) are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example;" and "NB" which means "note well."

What is claimed is:

1. A memory cell, comprising:
   a word line;
   a bit line;
   a complementary bit line;
   a first node storing a bit value voltage level;
   a second node storing a complementary bit value voltage level;
   a first pull-down driver transistor coupled between said first node and a ground level;
   a first pull-up transistor coupled between said first node and a supply voltage source; and
   a stability switch coupled to at least one of said first pull-up transistor and said first pull-down transistor, for destabilizing said memory cell during a write operation,
   wherein the stability switch is dedicated for one memory cell to destabilize said one memory cell.

2. The memory cell of claim 1, wherein said stability switch is coupled between a voltage supply and said first pull-up transistor.

3. The memory cell of claim 1, wherein said stability switch is controlled by a signal line distributed in a word line direction of said memory cell.

4. The memory cell of claim 1, wherein said stability switch is controlled by a signal line distributed in a bit line direction of said memory cell.

5. The memory cell of claim 4, wherein said stability switch is a D-type switch.

6. The memory cell of claim 2, further comprising a normally-on switch connected in parallel with said stability switch between said voltage supply and said first pull-up transistor.

7. The memory cell of claim 6, wherein said stability switch is controlled by a signal line distributed in a word line direction of said memory cell.

8. The memory cell of claim 6, wherein said stability switch is controlled by a signal line distributed in a bit line direction of said memory cell.

9. The memory cell of claim 2, wherein said memory cell comprises a second pull-up transistor and second pull-down transistor, and a second stability switch connected between said voltage supply and said second pull-up transistor.

10. The memory cell of claim 9, wherein said first stability switch and second stability switch are controlled by a common signal line.

11. The memory cell of claim 10, wherein said common signal line is distributed in a word line direction.

12. The memory cell of claim 10, wherein said common signal line is distributed in a bit line direction.

13. The memory cell of claim 9, wherein said first stability switch is controlled by a first signal line and second stability switch is controlled by a second signal line.

14. The memory cell of claim 11, wherein said first signal line is distributed along a word line direction, and said second signal line is distributed along a bit line direction.

15. The memory cell of claim 1, wherein said stability switch is cut off during a write operation.

16. The memory cell of claim 1, wherein said stability switch is cut off during a write operation and during a read operation.

17. A method of destabilizing a memory cell for facilitating a write operation, comprising the steps of providing a stability switch coupled between one of a voltage supply or a ground terminal and a memory cell, and causing said stability switch to be turned off during said write operation, wherein the stability switch is dedicated for one memory cell to destabilize said one memory cell.

18. The method of claim 17, further comprising the step of causing said stability switch to be turned off during a read operation.

19. The method of claim 17, wherein said stability switch is controlled by a signal line distributed along a word line direction of said memory cell.

20. A method of destabilizing a memory cell for facilitating a write operation, comprising the steps of providing a stability switch coupled between one of a voltage supply or a ground terminal and a memory cell, and causing said stability switch to be turned off during said write operation, wherein said stability switch is controlled by a signal line distributed along a bit line direction of said memory cell.

* * * * *